(12) United States Patent
Ahn

(10) Patent No.: US 6,859,105 B2
(45) Date of Patent: Feb. 22, 2005

(54) VARIABLE GAIN CONTROL CIRCUIT AND INTEGRATED CIRCUIT DEVICE HAVING THE SAME

(75) Inventor: Kwang-ho Ahn, Yongin (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/349,401

(22) Filed: Jan. 22, 2003

(65) Prior Publication Data

US 2003/0234690 A1 Dec. 25, 2003

(30) Foreign Application Priority Data

Jun. 20, 2002 (KR) .......................... 2002-34623

(51) Int. Cl.[7] ............................ H03F 3/191; H03G 3/30
(52) U.S. Cl. ..................... 330/302; 330/282; 330/283
(58) Field of Search ............................... 330/278, 279, 330/281, 282, 283, 285, 302, 284

(56) References Cited

U.S. PATENT DOCUMENTS 5,023,569 A * 6/1991 Raven ..................... 330/285
6,104,246 A * 8/2000 La Ferrara et al. ......... 330/282
6,388,525 B1 * 5/2002 Bien .......................... 330/282
6,437,649 B2 * 8/2002 Miyashita et al. .......... 330/302

FOREIGN PATENT DOCUMENTS

KR   P2001-0042366   5/2001
KR   P2002-0016515   3/2002

* cited by examiner

*Primary Examiner*—Steven J. Mottola
(74) *Attorney, Agent, or Firm*—F. Chau & Associates, LLC

(57) ABSTRACT

A variable gain control circuit is provided comprising a bipolar transistor for amplifying an input signal applied to a base, and outputs an output signal via a collector; a serial exchanging unit connected between an emitter of the bipolar transistor; a first voltage node; a parallel exchanging unit connected between the collector of the bipolar transistor and the first voltage node, and wherein the gain of the variable gain control circuit increases in a high gain mode by activating the serial exchanging unit and deactivating the parallel exchanging unit, and the gain of the variable gain control circuit decreases in a low gain mode by deactivating the serial exchanging unit and activating the parallel exchanging unit.

15 Claims, 4 Drawing Sheets

VARIABLE GAIN CONTROL CIRCUIT AND INTEGRATED CIRCUIT DEVICE HAVING THE SAME

BACKGROUND OF THE INVENTION

1. Field of the Invention

The present invention relates to a variable gain control circuit, and more particularly, to a variable gain control circuit embodied in an integrated circuit device.

2. Description of the Related Art

A variable gain control circuit is used for controlling the amount of transmission output gain depending on distance or other communication environment, particularly when signals are communicated and a wave is emitted or received between mobile communication terminals and base stations. Control of the output gain can improve power efficiency and prevent unnecessary current from being leaked to neighboring channels.

FIG. 1 is a circuit diagram of a conventional variable gain control circuit. Referring to FIG. 1, the conventional variable gain control circuit comprises an input matching unit 111, an analog control circuit 121, an output matching unit 131, bipolar transistors 141~143 and an inductor 151.

Similar to a difference amplifier, current flows to the bipolar transistor 143 based on the difference of voltages applied to the bases of the bipolar transistors 141, 142. The amount of current which flows to the bipolar transistor 143 is controlled by controlling the size of a control voltage Vc applied to the bases of transistors 141,142 through an analog control circuit 121. When a high frequency signal S1 is input to the bipolar transistor 143 through input matching unit 111, the variable gain control circuit 101 amplifies this signal, and an output signal is generated and output at S2 through the output matching unit 131. The input matching unit 111 impedance matches the input signal S1 and the output matching unit 131 impedance matches circuitry connected to S2.

In the variable gain control circuit 101, an additional analog control circuit 121 is required for more precise linear control. Thus, an integrated circuit device equipped with the variable gain control circuit 101 requires more space, has higher current dissipation and parasitic effects.

Accordingly, a need exists for a variable gain control circuit having a wide range of variable gains without an analog control circuit.

SUMMARY OF THE INVENTION

A variable gain control circuit is provided comprising: a bipolar transistor for amplifying an input signal applied to a base, and outputs an output signal via a collector; a serial exchanging unit connected between an emitter of the bipolar transistor; and a first voltage node; and a parallel exchanging unit connected between the collector of the bipolar transistor and the first voltage node, and wherein the gain of the variable gain control circuit increases in a high gain mode by activating the serial exchanging unit and deactivating the parallel exchanging unit, and the gain of the variable gain control circuit decreases in a low gain mode by deactivating the serial exchanging unit and activating the parallel exchanging unit. Preferably, a portion of the output signal of the bipolar transistor is introduced into the bipolar transistor through the parallel exchanging unit.

The variable gain control circuit according to one embodiment of the invention further comprise an input matching unit which is connected to the base of the bipolar transistor and impedance matches the input signal to the bipolar transistor; and an output matching unit which is connected to the collector of the bipolar transistor and impedance matches the output signal to an outer device connected to the variable gain control circuit.

The serial exchanging unit includes a circuit which when activated, has a reduced equivalent resistance and when deactivated, has an increased equivalent resistance.

The serial exchanging unit is preferably connected between an emitter of the bipolar transistor and ground and operates in response to a first control voltage which is at a high level in a high gain mode and at a low level in a low gain mode, and the parallel exchanging unit is connected between the base and the collector of the bipolar transistor and operates in response to a second control voltage which is at a low level in a high gain mode and at a high level in a low gain mode.

An integrated circuit device having a variable gain control circuit is also provided comprising: an input pad for receiving an external input signal; a first control pad for receiving a first control voltage; a second control pad for receiving a second control voltage; an output pad for outputting an output signal of the variable gain control circuit; a bipolar transistor for receiving and amplifying the input signal and outputting the output signal via a collector; a feedback circuit for selectively coupling a portion of the output signal to the base of the bipolar transistor for varying the gain of the amplification. The feedback circuit includes a first capacitor for coupling high frequency portions of the output signal to the input of the bipolar transistor.

The integrated circuit device further comprises a second capacitor which is connected to a gate of an electric field effect transistor and removing high frequency noise present at the gate of the electric field effect transistor.

A serial exchange circuit comprising a first electric field effect transistor for receiving a signal input from the input pad through a gate, its drain is connected to an emitter of the bipolar transistor and its source is grounded; and a first inductor which is connected between the drain and the source of the first electric field effect transistor.

The integrated circuit device according to a preferred embodiment further includes an input matching unit comprising an inductor connected between the input pad and ground; and a capacitor connected between the inductor and the base of the bipolar transistor, and an output matching unit is connected between a collector of the bipolar transistor and the output pad, and matches a signal output through the output pad to an outer device connected to the output pad.

BRIEF DESCRIPTION OF THE DRAWINGS

The embodiments of the present invention will become more apparent when the detail designation of preferred embodiments is read with reference to the attached drawings in which.

DETAILED DESCRIPTION OF PREFERRED EMBODIMENTS

Figure 1:
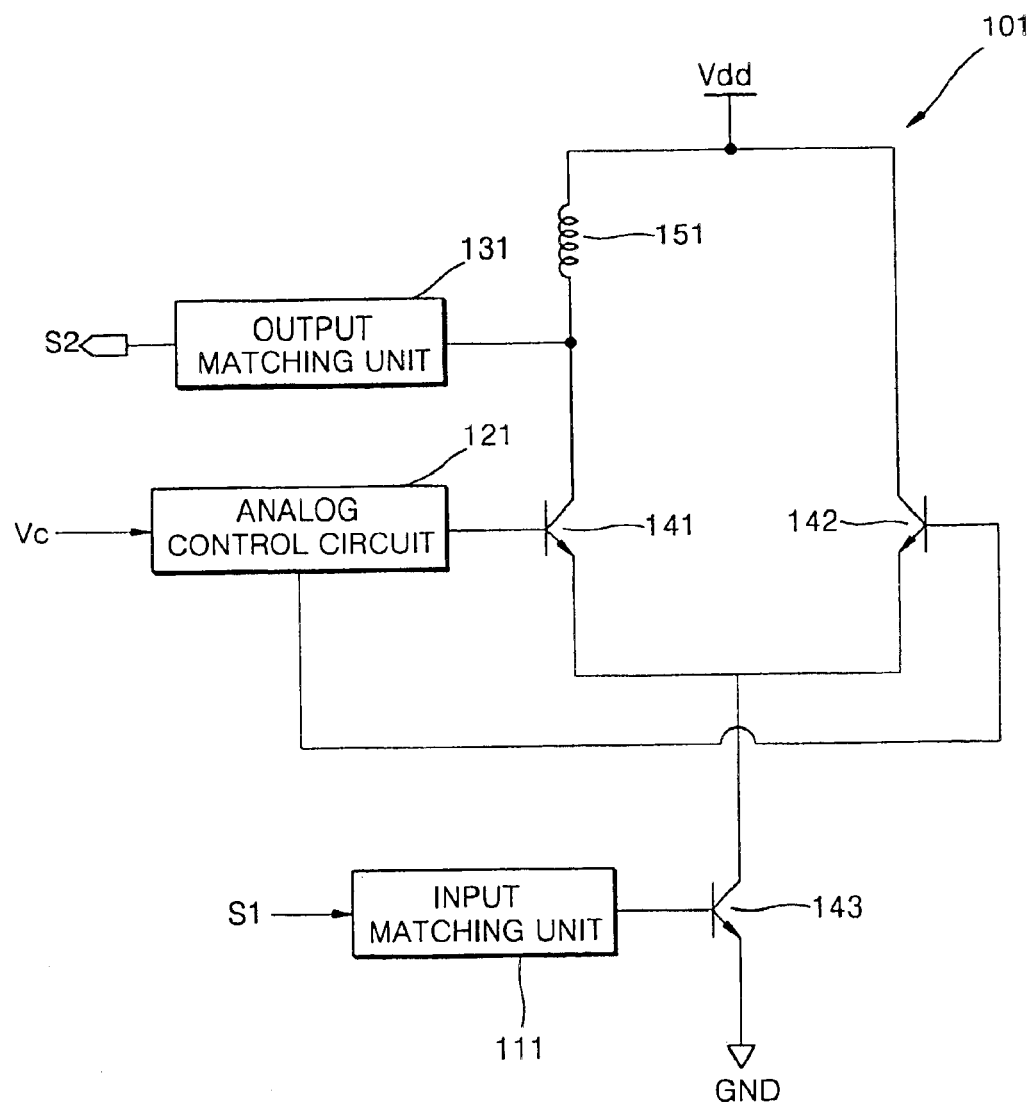
FIG. 1 is a circuit diagram of a conventional variable gain control circuit.

Preferred embodiments of the present invention will now be described more fully with reference to the accompanying drawings. The same reference numerals in different drawings represent the same element.

Figure 2:
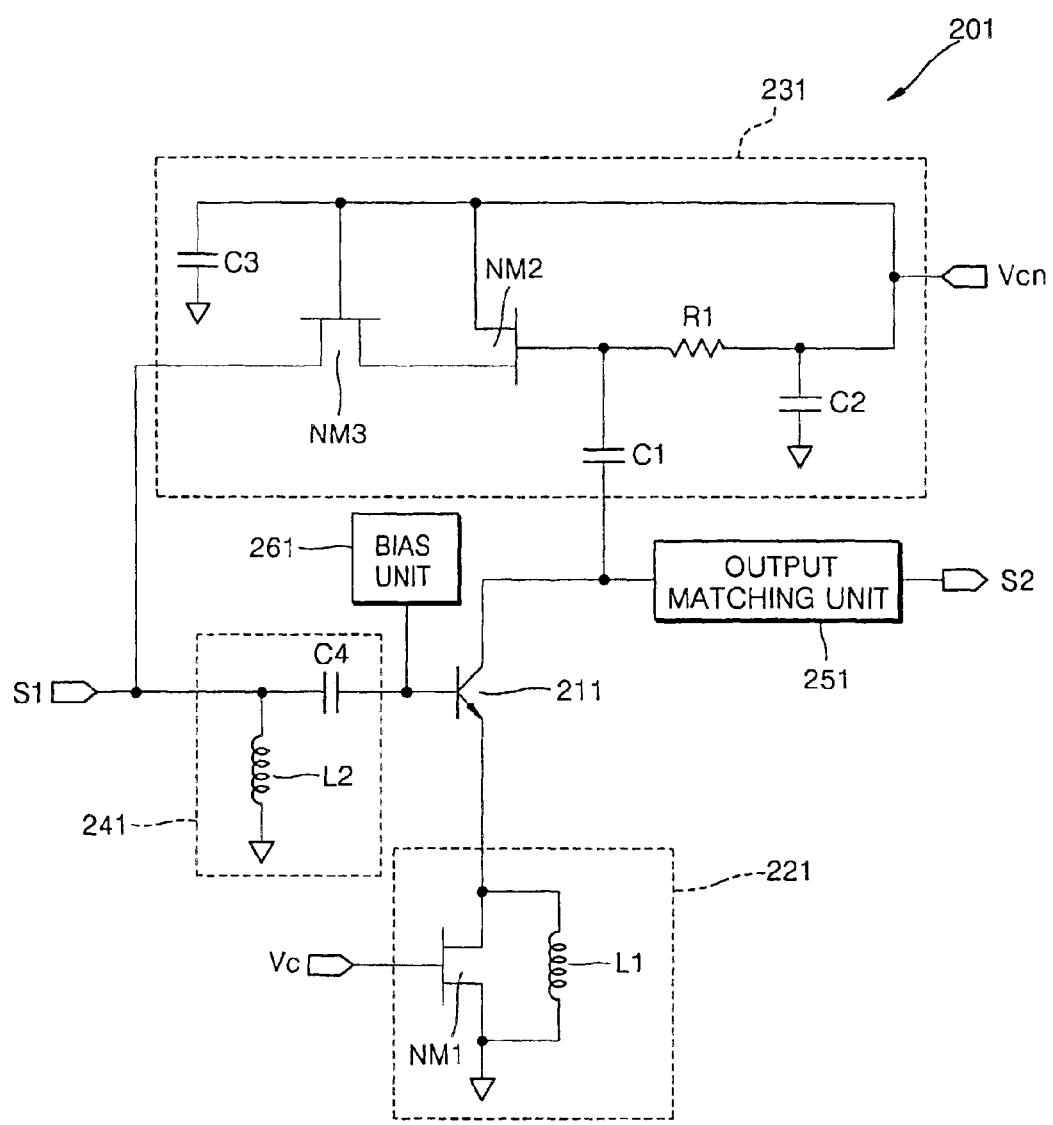
FIG. 2 is a circuit diagram of a variable gain control circuit according to an embodiment of the present invention.

FIG. 2 is a circuit diagram of a variable gain control circuit according to a preferred embodiment of the present invention. Referring to FIG. 2, the variable gain control circuit 201 comprises a bipolar transistor 211, a serial exchanging unit 221, a parallel exchanging unit 231, an input matching unit 241, an output matching unit 251, and a bias unit 261.

The bipolar transistor 211 amplifies an external input signal S1 applied to the base and outputs an output signal S2 at its collector. The input signal S1 and the output signal S2 are high frequency signals. The bipolar transistor 211 is an NPN transistor.

The serial exchanging unit 221 is connected between an emitter of the bipolar transistor 211 and a ground GND. The serial exchanging unit 221 comprises a first electric field effect transistor NM1, and a first inductor L1. It is preferable that the first electric field effect transistor NM1 is configured with an Enhancement N channel MOSFET (Metal Oxide Semiconductor Field Effect Transistor). Preferably, the first inductor L1 is a spiral inductor embodied in the integrated circuit device (401 in FIG. 4), the inductance of the first inductor is less than about 15 nH. This is due to its volume and parasitic elements.

The gate of the first electric field effect transistor NM1 is applied by the first control voltage Vc. The first control voltage Vc is at a high level, for example, at more than 2 volt when in a high gain mode; and at a low level, for example, at less than about 1.0 volt in a low gain mode. Accordingly, the first electric field effect transistor NM1 is activated in the high gain mode and has a low equivalent resistance, of several ohms. At the low gain mode when NM1 is deactivated, it has a high equivalent resistance, of several kilohms kΩ.

Since the first electric field effect transistor NM1 has a low equivalent in the high gain mode, the serial exchanging unit 221 also has a low equivalent resistance. In the low gain mode, the first electric field effect transistor NM1 has a high equivalent resistance (several kΩ), and the first inductor L1 has an equivalent resistance of several tens of ohms. The serial exchanging unit 221 has an equivalent resistance of several tens of Ω. Thus, the equivalent resistance of serial exchanging unit 221 is higher in the low gain mode as compared to the high gain mode.

The parallel exchanging unit 231 is connected between the collector of the bipolar transistor 211 and the base. The parallel exchanging unit 231 comprises a second and a third electric field effect transistors NM2, NM3, a resistor R1, and a first through third capacitors C1~C3.

A first capacitor C1 is connected between the collector of the bipolar transistor 211 and the base of the second electric field effect transistor NM2 and acts to couple high frequency signals therebetween. The second control voltage Vcn is applied to the second and the third electric field effect transistors NM2 and NM3. The second and the third capacitors C2 and C3 can act to filter high frequency noise input to the second and the third electric field effect transistors NM2 and NM3. It is preferable that each of the second and the third electric field effect transistors NM2 and NM3 is configured with enhancement N-channel MOS FET.

The second control voltages Vcn is applied to the gates of the second and the third electric field effect transistors NM2 and NM3. The second control voltage Vcn has a low level such as less than 1 volt in a high gain mode and a high level such as more than 2 volt in a low gain mode. The second control voltage Vcn is an inversed voltage of the first control voltage Vc. Since the second and the third electric field effect transistors NM2 and NM3 are inactivated in the high gain mode, the parallel exchanging unit 231 appears as an open circuit to the bipolar transistor 211. During low gain mode, the second and the third electric field effect transistors NM2 and NM3 are activated and a portion of the output signal of the bipolar transistor 211 appears at the base of the bipolar transistor 211 through the parallel exchanging unit 231 during high frequency operation. Accordingly, the circuit of the parallel exchanging unit 231 selectively feedback the amplified signal and the gain of the variable gain control circuit is decreased in a low gain mode.

In the high gain mode, Vcn is low and NM3 is turned off. Thus, if the parallel exchanging unit 231 is comprised of only the second electric field effect transistor NM2 (without NM3), the parallel exchanging unit 231 is not completely an open circuit to the bipolar transistor 211. According to an embodiment of the present invention, the parallel exchanging unit 231 comprising the second and the third electric field effect transistors NM2 and NM3 is a completely open circuit to the bipolar transistor 211 in the high gain mode.

An input matching unit 241 is connected to the base of the bipolar transistor 211. The input matching unit 241 comprises a second inductor L2 and a fourth capacitor C4. The second inductor L2 and the fourth capacitor C4 are applied to the base of the bipolar transistor 211 in a low frequency state so that the bias is stable, and impedance matches an input signal S1 to the bipolar transistor 211 at high frequency.

The output matching unit 251 is connected to the collector of the bipolar transistor 211. The output matching unit 251 matches the output signal S2 output from the bipolar transistor 211 to an external device connected to the collector of the bipolar transistor.

The bias unit 261 is connected to the base of the bipolar transistor 211 to provide bias to the bipolar transistor 211. Preferably, the bias unit 261 comprises the bipolar transistor 211 and a current mirror, and provides a current to the base of the bipolar transistor 211.

The operation of the variable gain control circuit 201 will now be described.

First, the first control voltage Vc is at high level and the second control voltage Vcn is at a low level in a high gain mode. The serial exchanging unit 221 becomes activated and has a very small equivalent resistance, and the parallel exchanging unit 231 is inactivated and acts as an open. Accordingly, the gain of the bipolar transistor 211 increases and the gain of the variable gain control circuit 201 increases.

The first control voltage Vc is a low level and the second control voltage Vcn is a high level in a low gain mode. The serial exchanging unit 221 is inactivated and the equivalent resistance of the serial exchanging unit 221 increases as compared to that of the high gain mode. Accordingly, the gain of the bipolar transistor 211 is lower than that of the high gain mode. However, the parallel exchanging unit 231 is activated and some of the output signals S2 are introduced into the base of the bipolar transistor 211, accordingly the gain of the variable gain control circuit 201 becomes low.

As shown in FIG. 2, the variable gain control circuit 201 operates without an analog control circuit for linear control, yet the variable gain increases in a high gain mode and decreases in a low gain mode.

Figure 3:
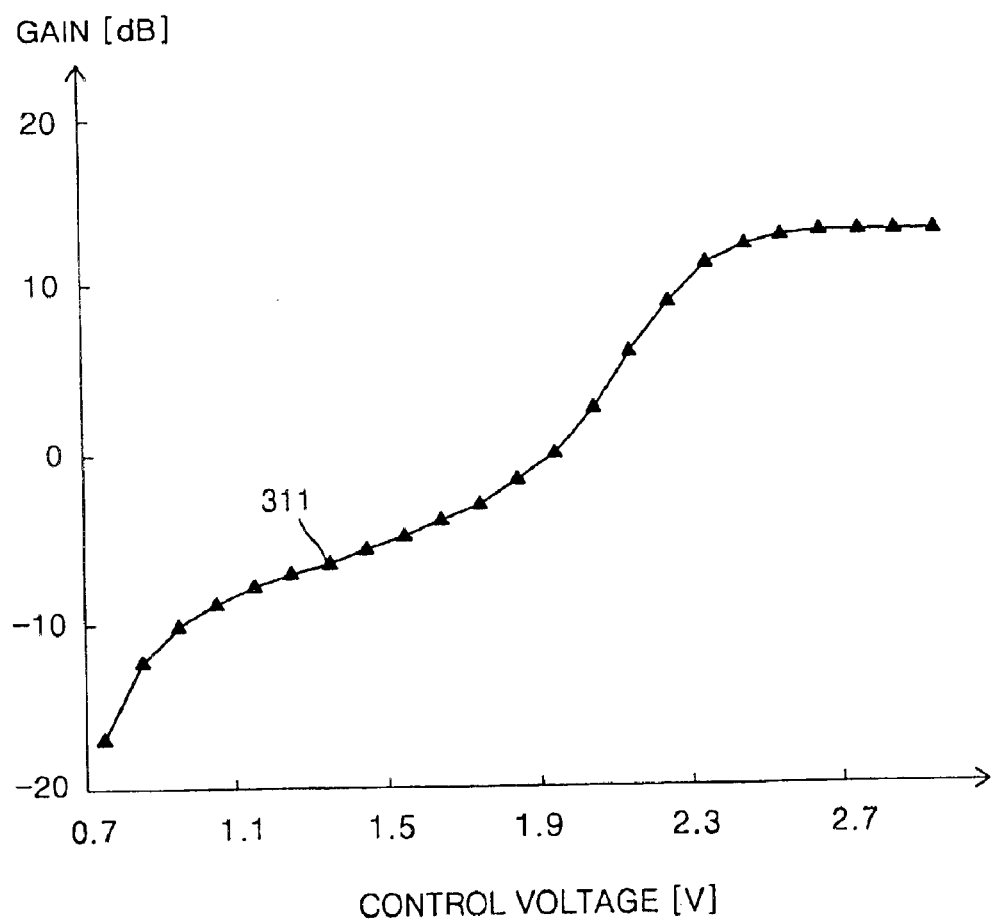
FIG. 3 is a view showing a curved line of characteristics of the variable gain control circuit illustrated in FIG. 2.

FIG. 3 is a view showing a variable gain characteristic curve of the variable gain control circuit 201 shown in FIG.

2. The variable gain characteristic curve 311 shown in FIG. 3 is measured at 900 MHz, an operating frequency of a cellular phone. Referring to FIG. 3, a variable gain of the variable gain control circuit 201 ranges between −16.9 and 13.1 dB versus the control voltage Vc ranged between 0.7 and 2.7V. In other words, the variable gain control circuit 201 has a variable characteristic of 13.6 dB/V. The variable gain of a conventional variable gain control circuit generally ranges between 6.8 and 9.5 dB/V. Accordingly, the variable gain of a variable gain control circuit 201 according to a preferred embodiment of the present invention is improved by 50~100% as compared to the variable gain of the prior art.

Figure 4:
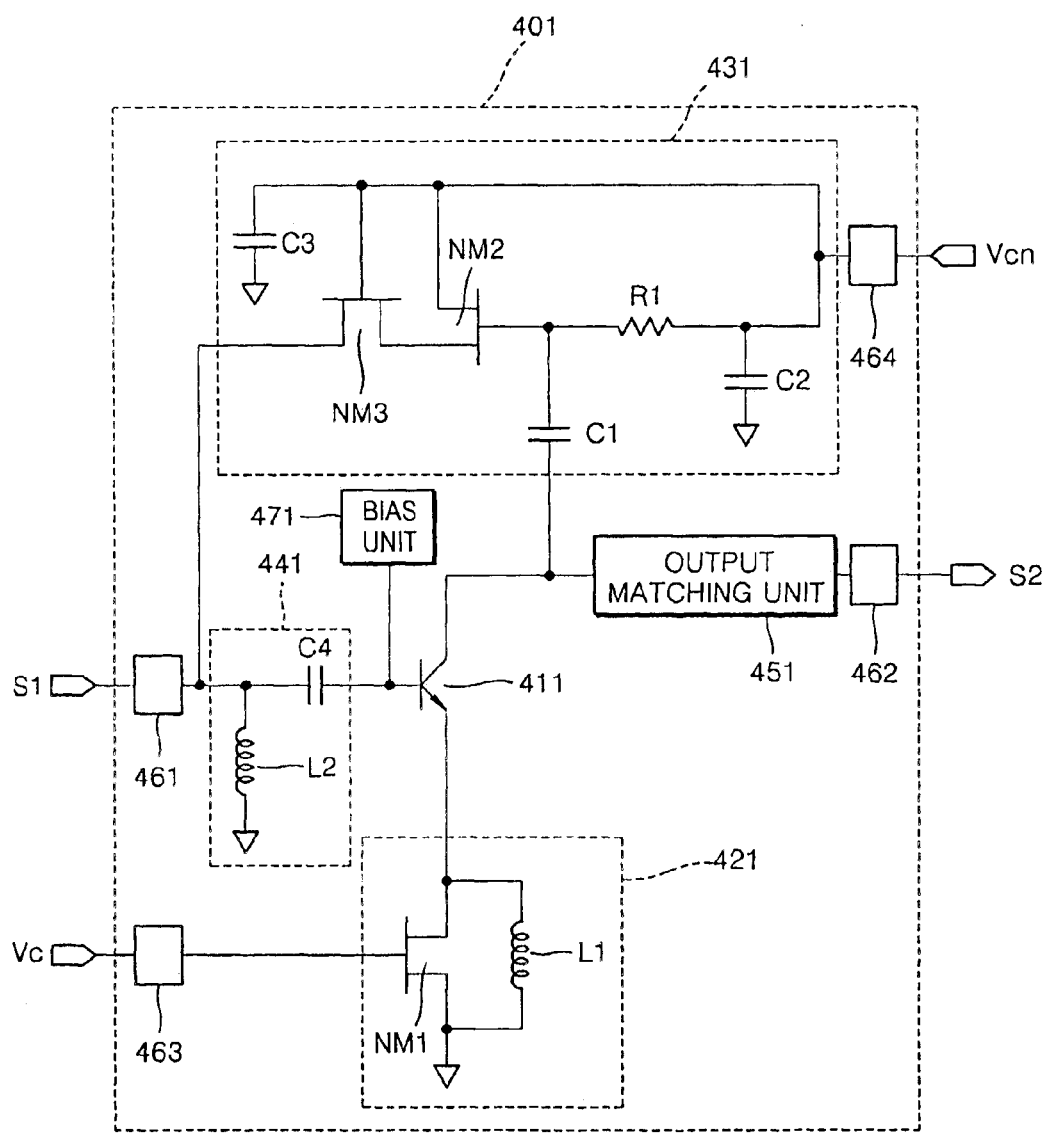
FIG. 4 is a circuit diagram of an integrated circuit device having a variable gain control circuit according to the present invention.

FIG. 4 is a circuit diagram of an integrated circuit device having a variable gain control circuit of the present invention. Referring to FIG. 4, the integrated circuit device 401 comprises an input pad 461, an output pad 462, first and second control pads 463 and 464, a bipolar transistor 411, a serial exchanging unit 421, a parallel exchanging unit 431, an output matching unit 451 and a bias unit 471.

The serial exchanging unit 421 comprises a first electric field effect transistor NM1 and a first inductor L1. The parallel exchanging unit 431 comprises a first through a third capacitors C1~C3, a resistance R1 and a second and a third electric field effect transistors NM2 and NM3. The input matching unit 441 comprises a second inductor L2 and a fourth capacitor C4. An external signal s1 is input to the input matching unit 441 through the input pad 461.

The first control voltage Vc is input to the base of the first electric field effect transistor NM1 from the outside through the first control pad 463. The second control voltage Vcn is input to the bases of the second and the third electric field effect transistors NM2 and NM3 from the outside through the second control pad 464. The output signal S2 of the integrated circuit device 401 is output through the output pad 462. The bipolar transistor 411 receives at its base a signal output from the input matching unit 441. This signal is amplified and transmitted to the output matching unit 451 through the collector.

The first electric field effect transistor NM1 receives at its gate a first control voltage Vc input from the first control pad 463. The drain is connected to the emitter of the bipolar transistor 411, and the source is connected to ground GND. The first inductor L1 is connected between the drain and the source of the first electric field effect transistor NM1. The resistor R1 is connected between the gate of the second electric field effect transistor NM2 and the second control pad 464. The first capacitor C1 is connected between the collector of the bipolar transistor 411 and the gate of the second electric field effect transistor NM2.

The gate and the drain of the third electric field effect transistor NM3 are connected to the drain and the source of the second electric field effect transistor NM2. The gate of the third electric field effect transistor NM3 is connected to the second control pad 464.

The bias unit 471 provides bias to the base of the bipolar transistor 411. The fourth capacitor C4 is connected between the base of the bipolar transistor 411 and the input pad 461. The second inductor L2 is connected between the input pad 461 and ground GND.

The bipolar transistor 411, the serial exchanging unit 421, the parallel exchanging unit 431, the input matching unit 441, the output matching unit 451 and the bias unit 471 are the same in configuration, function and effect, as those shown in FIG. 2, and thus their descriptions will not be repeated.

As described above, according to the embodiments of present invention, the variable gain control circuit 201 has improved variable gain characteristics and can be adapted in a variety of fields. In addition, since the variable gain control circuit embodied in the integrated circuit device 401 does not employ additional analog control circuit, the size of the integrated circuit device 401 decreases. Accordingly, the manufacture costs of the integrated circuit device 401 is reduced.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A variable gain control circuit comprising:
    a bipolar transistor for amplifying an input signal applied to a base, and outputs an output signal via a collector;
    a serial exchanging unit connected to an emitter of the bipolar transistor;
    a first voltage node;
    a parallel exchanging unit connected between the collector of the bipolar transistor and the first voltage node, and
    wherein the gain of the variable gain control circuit increases in a high gain mode by activating the serial exchanging unit and deactivating the parallel exchanging unit, and the gain of the variable gain control circuit decreases in a low gain mode by deactivating the serial exchanging unit and activating the parallel exchanging unit.

2. The variable gain control circuit of claim 1, further comprising an input matching unit which is connected to the base of the bipolar transistor and impedance matches the input signal to the bipolar transistor.

3. The variable gain control circuit of claim 1, further comprising an output matching unit which is connected to the collector of the bipolar transistor and impedance matches the output signal to an outer device connected to the variable gain control circuit.

4. The variable gain control circuit of claim 1, wherein the serial exchanging unit includes a circuit which when activated, has a reduced equivalent resistance and when deactivated, has an increased equivalent resistance.

5. The variable gain control circuit of claim 1, wherein a portion of the output signal of the bipolar transistor is introduced into the bipolar transistor through the parallel exchanging unit.

6. A variable gain control circuit comprising:
    a bipolar transistor for amplifying an input signal applied to a base, and outputs an output signal via a collector;
    a serial exchanging unit connected to an emitter of the bipolar transistor;
    a first voltage node;
    a parallel exchanging unit connected between the collector of the bipolar transistor and the first voltage node, and
    wherein the gain of the variable gain control circuit increases in a high gain mode by activating the serial exchanging unit and deactivating the parallel exchanging unit, and the gain of the variable gain control circuit decreases in a low gain mode by deactivating the serial exchanging unit and activating the parallel exchanging unit; and the serial exchanging unit is connected between an emitter of the bipolar transistor and ground and operates in response to a first control voltage which is at a high level in a high gain mode and at a low level in a low gain mode, and the parallel exchanging unit is connected between the base and the collector of the bipolar transistor and operates in response to a second control voltage which is at a low level in a high gain mode and at a high level in a low gain mode.

7. The variable gain control circuit of claim 6, wherein the parallel exchanging unit includes circuit for coupling a portion of the signal output from the collector of the bipolar transistor to the base of the bipolar transistor.

8. An integrated circuit device having a variable gain control circuit comprising:

an input pad for receiving an external input signal;

a first control pad for receiving a first control voltage;

a second control pad for receiving a second control voltage;

an output pad for outputting an output signal of the variable gain control circuit;

a bipolar transistor for receiving and amplifying the input signal and outputting the output signal via a collector;

a feedback circuit for selectively coupling a portion of the output signal to the base of the bipolar transistor for varying the gain of the amplification, wherein the feedback circuit comprising:

a first capacitor for coupling high frequency portions of the output signal; and a second capacitor which is connected to a gate of an electric field effect transistor and removing high frequency noise present at the gate of the electric field effect transistor.

9. An integrated circuit device having a variable gain control circuit comprising:

an input pad for receiving an external input signal;

a first control pad for receiving a first control voltage;

a second control pad for receiving a second control voltage;

an output pad for outputting an output signal of the variable gain control circuit;

a bipolar transistor for receiving and amplifying the input signal and outputting the output signal via a collector;

a feedback circuit for selectively coupling a portion of the output signal to the base of the bipolar transistor for varying the gain of the amplification; and a serial exchange circuit comprising:

a field effect transistor for receiving a signal input from the input pad through a gate, wherein its drain is connected to the emitter of the bipolar transistor and its source is grounded; and a first inductor which is connected between the drain and the source of the electric field effect transistor.

10. The integrated circuit device of claim 9, wherein the serial exchanging unit includes a circuit which when activated, has a reduced equivalent resistance and when deactivated, has an increased equivalent resistance.

11. A variable gain control circuit comprising:

a transistor for amplifying an input signal and outputting an amplified signal;

feedback means connected to a first node of the transistor for selectively feeding back a portion of the amplified signal to the input of the transistor, and non-feedback means connected to a second node of the transistor for increasing the amplification of the transistor in a high gain mode and decreasing the amplification of the transistor in a low gain mode, wherein the non-feedback means has a reduced equivalent resistance when activated and has an increased equivalent resistance when deactivated.

12. The variable gain control circuit of claim 11, further comprising means for impedance matching the input signal to the input of the transistor.

13. The variable gain control circuit of claim 11, further comprising means for impedance matching the output signal to an outer device connected to the variable gain control circuit.

14. The variable gain control circuit of claim 11, wherein the feedback means for selectively feeding back includes a capacitor for coupling high frequency portions of the output signal to the input of the transistor.

15. The variable gain control circuit of claim 11, wherein the feedback means for selectively feeding back includes a circuit connected to the output of the transistor and acts as an open circuit during a predetermined mode of operation.

* * * * *